United States Patent
Lee et al.

(10) Patent No.: US 8,058,097 B2
(45) Date of Patent: Nov. 15, 2011

(54) METHODS OF FORMING RESISTIVE MEMORY DEVICES

(75) Inventors: Jang-Eun Lee, Gyeonggi-do (KR); Dae-Kyom Kim, Daejeon (KR); Jun-Ho Jeong, Gyeonggi-do (KR); Se-Chung Oh, Gyeonggi-do (KR); Kyung-Tae Nam, Gyeonggi-do (KR); Hyun-Jun Sim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/784,230

(22) Filed: May 20, 2010

(65) Prior Publication Data

US 2010/0233849 A1    Sep. 16, 2010

Related U.S. Application Data

(62) Division of application No. 12/207,889, filed on Sep. 10, 2008, now Pat. No. 7,750,336.

(30) Foreign Application Priority Data

Sep. 10, 2007  (KR) .................................. 2007-91660

(51) Int. Cl.
*H01L 21/36* (2006.01)

(52) U.S. Cl. .......................... 438/104; 438/381; 438/382
(58) Field of Classification Search ................... 438/104, 438/381, 382
See application file for complete search history.

(56) References Cited

U.S. PATENT DOCUMENTS

2006/0215445 A1   9/2006 Baek et al.

FOREIGN PATENT DOCUMENTS

| JP | 2004-311512 | 11/2004 |
| JP | 2006-080259 | 3/2006 |
| KR | 1020060103705 A | 10/2006 |

*Primary Examiner* — Long Pham
(74) *Attorney, Agent, or Firm* — Myers Bigel Sibley & Sajovec

(57) ABSTRACT

Methods of forming a resistive memory device include forming an insulation layer on a semiconductor substrate including a conductive pattern, forming a contact hole in the insulation layer to expose the conductive pattern, forming a lower electrode in the contact hole, forming a variable resistive oxide layer in the contact hole on the lower electrode, forming a middle electrode in the contact hole on the variable resistive oxide layer, forming a buffer oxide layer on the middle electrode and the insulation layer, and forming an upper electrode on the buffer oxide layer. Related resistive memory devices are also disclosed.

12 Claims, 5 Drawing Sheets

METHODS OF FORMING RESISTIVE MEMORY DEVICES

RELATED APPLICATION

This application is a divisional of U.S. patent application Ser. No. 12/207,889 filed Sep. 10, 2008, now U.S. Pat. No. 7,750,336 which claims priority under 35 U.S.C §119 to Korean Patent Application No. 2007-91660, filed on Sep. 10, 2007, in the Korean Intellectual Property Office, the disclosure of which is incorporated by reference.

BACKGROUND

The present invention is related to semiconductor devices and methods of forming the same, and more particularly, to resistive semiconductor devices and methods of forming the same.

A semiconductor memory device may be classified as a volatile memory device or a non-volatile memory device, depending on whether or not a power supply is required for retaining the stored data in memory. A volatile memory device, such as a DRAM or an SRAM may have a rapid processing speed, but may be limited, in that a volatile memory device may require a power supply in order to save data. A non-volatile memory device, such as a phase-change memory device (PRAM), resistive memory device (RRAM), ferroelectrics memory device (FRAM), etc., may not require a power supply to retain data.

A resistive memory device (RRAM) may include one or more variable resistive oxide layers. The resistance of a variable resistive oxide layer varies in response to a program voltage supplied to an upper electrode and/or a lower electrode on opposite sides of the variable resistive oxide layer. The specific resistance of the variable resistive oxide layer may vary by up to more than 100 times, depending on the amplitude of the program voltage. The specific resistance of the variable resistive oxide layer may be maintained even when a power supply voltage is not supplied. In order to read data stored in an RRAM cell, voltage variance and/or current flow variance through a variable resistive oxide layer may be detected based on the difference in specific resistance of the variable resistive oxide layer. Thus, it can be determined whether the data recorded on the variable resistive oxide layer represents a logic "1" or a logic "0".

When a variable resistive oxide layer is switched from a high resistance state to a low resistance state, a large amount of current may flow in the device. This may result in breakdown of insulation of the variable resistive oxide layer, and the reliability of the resistive memory device may be impaired.

SUMMARY

Embodiments of the present invention are related to resistive memory devices and methods of forming the same. In some embodiments, a resistive memory device includes a semiconductor substrate including a conductive pattern, an insulation layer including a contact hole on the semiconductor substrate, a lower electrode in the contact hole and in contact with the conductive pattern, a middle electrode disposed in the contact hole on the lower electrode, a variable resistive oxide layer between the lower electrode and the middle electrode, a buffer oxide layer on the insulation layer and the middle electrode, and an upper electrode on the buffer oxide layer.

In some embodiments, methods of forming a resistive memory device include forming an insulation layer on a semiconductor substrate including a conductive pattern, forming a contact hole in the insulation layer to expose the conductive pattern, forming a lower electrode in the contact hole, forming a variable resistive oxide layer in the contact hole on the lower electrode, forming a middle electrode in the contact hole on the variable resistive oxide layer, forming a buffer oxide layer on the middle electrode and the insulation layer, and forming an upper electrode on the buffer oxide layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
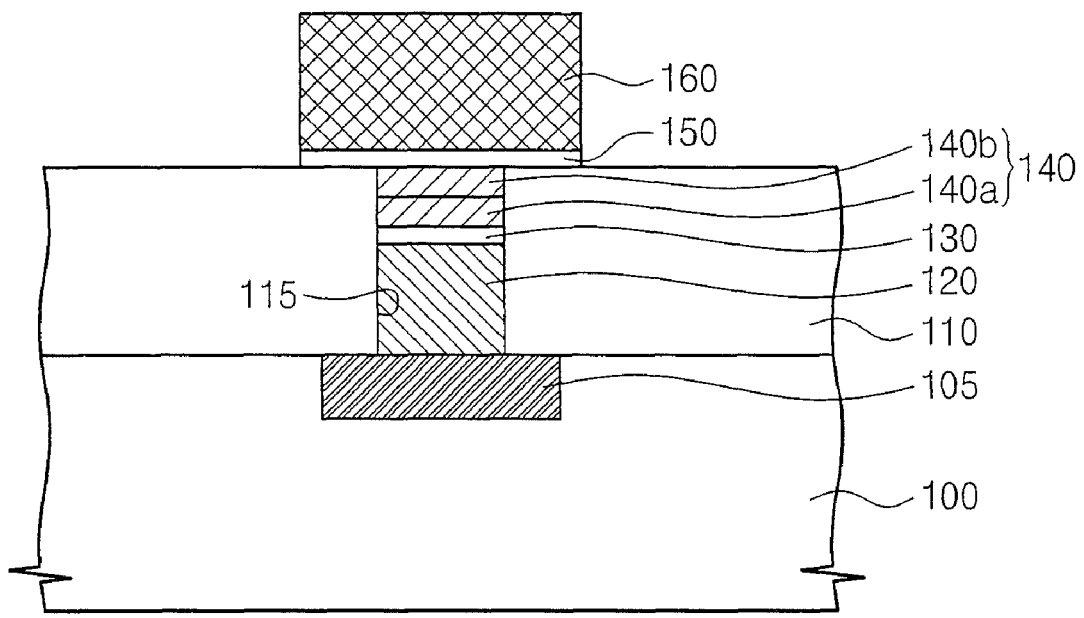
FIG. 1 is a cross-sectional view illustrating an embodiment of a resistive memory device according to some embodiments of the present invention.

Embodiments of the present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Referring to FIG. 1, a resistive memory device according to some embodiments of the present invention will be described.

A semiconductor substrate 100 including a conductive pattern 105 is provided. An insulation layer 110 having a contact hole 115 therein is disposed on the semiconductor substrate 100. A lower electrode 120 is disposed in the contact hole 115, so that the lower electrode 120 is in contact with the conductive pattern 105. The lower electrode 120 may include, for example, TiN, Ru, Ir, Ni, cobalt-iron-boron alloy, nickel-iron alloy, and/or tantalum.

A middle electrode 140 is disposed in the contact hole 115 on the lower electrode 120. The middle electrode 140 may include, for example, Ru, Ir, Ni, cobalt-iron-boron alloy, nickel-iron alloy, and/or tantalum. In some embodiments, the middle electrode 140 may include a first middle electrode 140a and a second middle electrode 140b on the first middle electrode 140a, the first middle electrode 140a including tantalum and/or Ru, and the second middle electrode 140b including cobalt-iron-boron alloy.

A variable resistive oxide layer 130 is interposed between the lower electrode 120 and the middle electrode 140. The variable resistive oxide layer 130 may include, for example, titanium oxide. The variable resistive oxide layer 130 may have a thin thickness between about 5 Å and about 30 Å. Such thin thickness may be used to reduce insulation breakdown in the variable resistive oxide layer 130 when the current density is over $1 \times 10^4$ A/cm$^2$. Also, the variable resistive oxide layer 130 may have a width less than about 100 nm, for example, between about 10 nm and about 60 nm. Such a small width may be used because when the width of the variable resistive oxide layer 130 is large, a large amount of current may flow when a state of the variable resistive oxide layer 130 is converted to a low resistance state (i.e., a set state), which may result in insulation breakdown of the variable resistive oxide layer 130.

A buffer oxide layer 150 is disposed on the middle electrode 140 and the insulation layer 110. The buffer oxide layer 150 may include, for example, magnesium oxide, titanium oxide, and/or aluminum oxide. The buffer oxide layer 150 may assist in providing reliable switching operation of the resistive memory device. For example, the buffer oxide layer 150 can control excess current when the variable resistive oxide layer 130 switches from a high resistance state to a low resistance state. The buffer oxide layer 150 may have a thickness of about 5 Å to about 30 Å, which may enable current to tunnel as much as the variable resistive oxide layer 130 does.

An upper electrode 160 is disposed on the buffer oxide layer 150. The upper electrode 160 may include, for example, a cobalt-iron-boron alloy. A resistive memory device having the buffer oxide layer 150 and the middle electrode 140 may have a stable and reliable switching characteristic.

Figure 2:
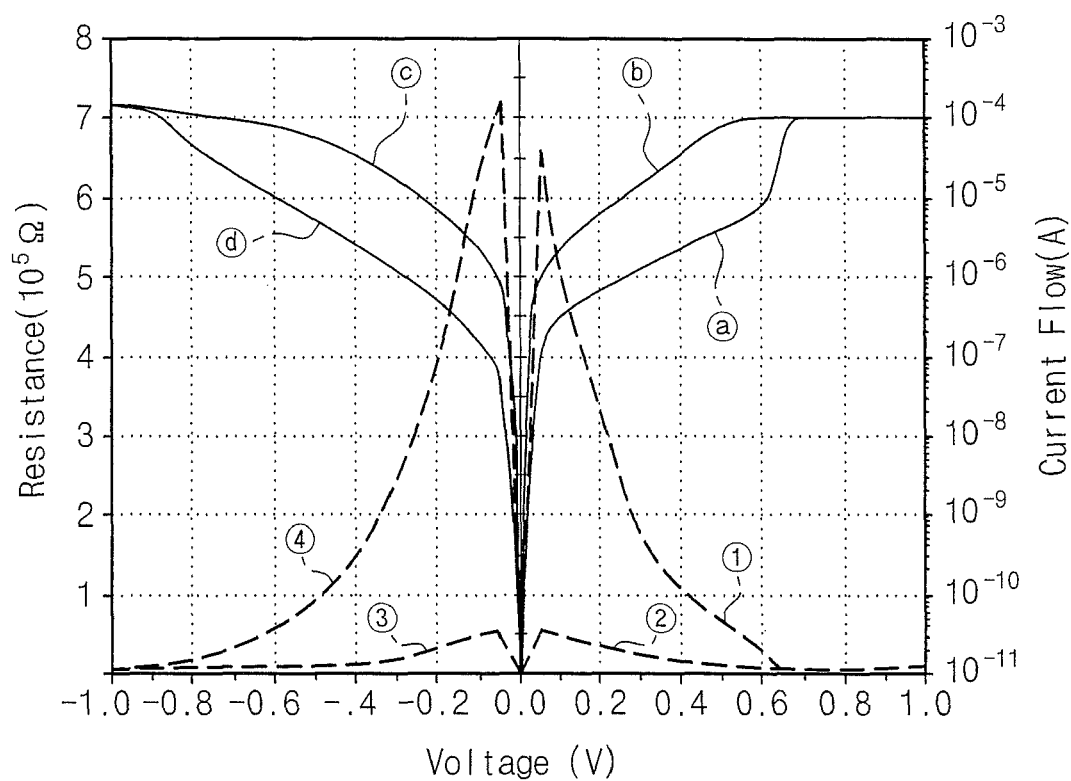
FIG. 2 is a graph illustrating switching characteristics of a resistive memory device according to some embodiments of the present invention.

FIG. 2 is a graph illustrating switching operations for a memory device according to some embodiments of the present invention. In FIG. 2, the x-axis indicates voltage value, the left side y-axis indicates resistance value, and the right side y-axis indicates current value. The dotted lines ①-④ are resistance-voltage curves, and the solid lines ⓐ-ⓑ are voltage-current curves.

The process of switching from a high resistance state to a low resistance state (set state) is illustrated on the right side of FIG. 2, with 0V as a reference value. In the resistance-voltage curve, the resistance value decreases as the device is switched from course ① to course ②. In the voltage-current curve, the current value increases as the device is switched from course ⓐ to course ⓑ. When the device is switched to a low resistance state, the buffer oxide layer may reduce and/or prevent excessive current flow in the device. Therefore, a reliable switching operation may be possible.

The process of switching from a low resistance state to a high resistance state (i.e., a reset state) is illustrated on the left side of FIG. 2, with 0V as the reference value. In the resistance-voltage curve, the resistance value increases as the device is switched from course ③ to course ④. In the voltage-current curve, current value decreases as the device is switched from course ⓒ to course ⓓ. The buffer oxide layer may reduce or prevent excessive current flow at a low resistance state. As shown in FIG. 2, a low current value of approximately $10^{-4}$ A is measured at a low resistance state.

Referring to FIG. 3 to FIG. 7, methods of forming a resistive memory device according to some embodiments of the present invention will be described.

Figure 3:
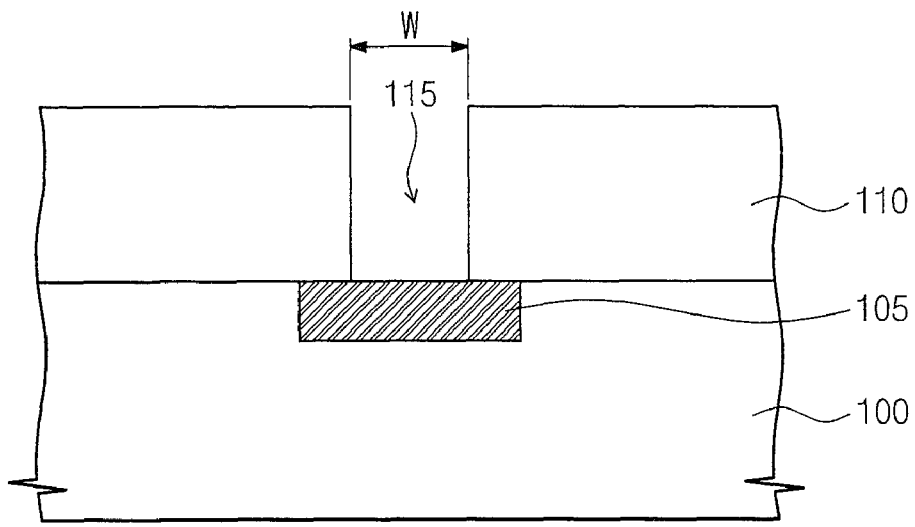
FIG. 3 to FIG. 7 are cross-sectional views illustrating resistive memory devices and methods of forming resistive memory devices according to some embodiments of the present invention.

Referring to FIG. 3, a semiconductor substrate 100 including a conductive pattern 105 is provided. An insulation layer 110 is formed on the semiconductor substrate 100. The insulation layer 110 may be made of, for example, silicon oxide. A contact hole 115 may be formed to expose the conductive pattern 105 in the insulation layer 110. The width W of the contact hole 115 may be smaller than about 100 nm, for example, about 10 nm to about 60 nm. The width of the pattern formed in the contact hole 115 depends on the width W of the contact hole 115.

Figure 4:
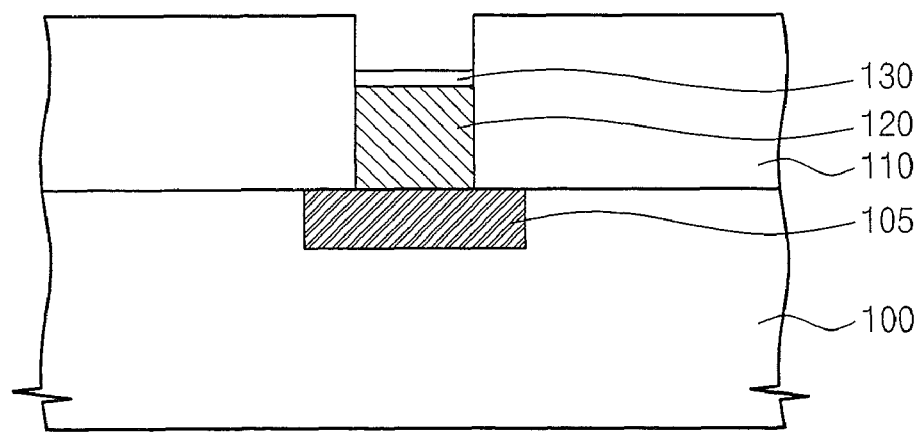

Referring to FIG. 4, a lower electrode 120 is formed in the contact hole 115. The lower electrode 120 may include, for example, TiN, Ru, Ir, Ni, cobalt-iron-boron alloy, nickel-iron alloy, and/or tantalum. The lower electrode 120 may be formed by filling the contact hole with a preliminary lower electrode layer and recessing the preliminary lower electrode. For example, the lower electrode 120 may be formed by forming the preliminary lower electrode layer, and performing a planarization process and etch back process on the preliminary lower electrode, sequentially.

A variable resistive oxide layer 130 is formed on the lower electrode 120. The variable resistive oxide layer 130 may have a thickness of about 5 Å to about 30 Å. The variable resistive oxide layer 130 may be formed by oxidizing the lower electrode 120. For example, the variable resistive oxide layer 130 may be formed by wet cleaning the lower electrode 120, and/or performing plasma oxidation or radical oxidation of the lower electrode 120.

Figure 5:
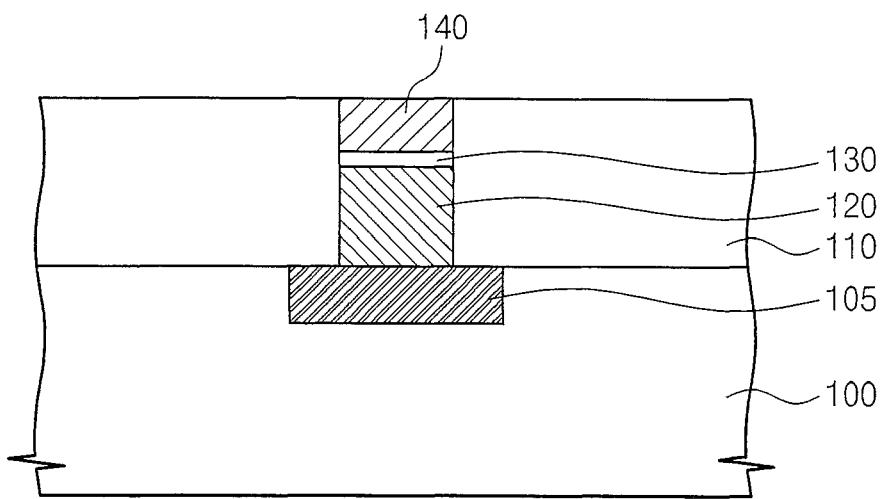
Figure 6:
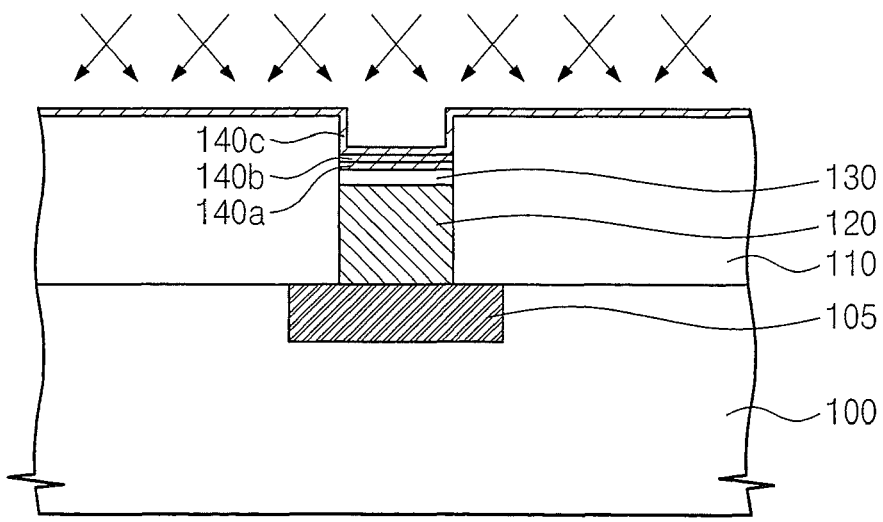

Referring to FIG. 5 and FIG. 6, a middle electrode 140 is formed on the variable resistive oxide layer 130, in the contact hole 115. The middle electrode 140 may include, for example, Ru, Ir, Ni, cobalt-iron-boron alloy, nickel-iron alloy, and/or tantalum. In some embodiments, the middle electrode 140 may include a first middle electrode and a second middle electrode on top of the first middle electrode. The first middle electrode may include, for example, tantalum and/or Ru, and the second middle electrode may include, for example, a cobalt-iron-boron alloy.

The middle electrode 140 may be formed by repeatedly performing deposition and ion beam etching processes (see FIG. 6). In other words, the middle electrode 140 may be formed in the contact hole 115 by depositing the first, second, and third preliminary middle electrodes 140a, 140b, and 140c, and then performing an ion beam etching process repeatedly. Alternatively, the middle electrode 140 may be formed by forming a middle electrode layer which fills the contact hole 115, then performing a planarization process.

Figure 7:
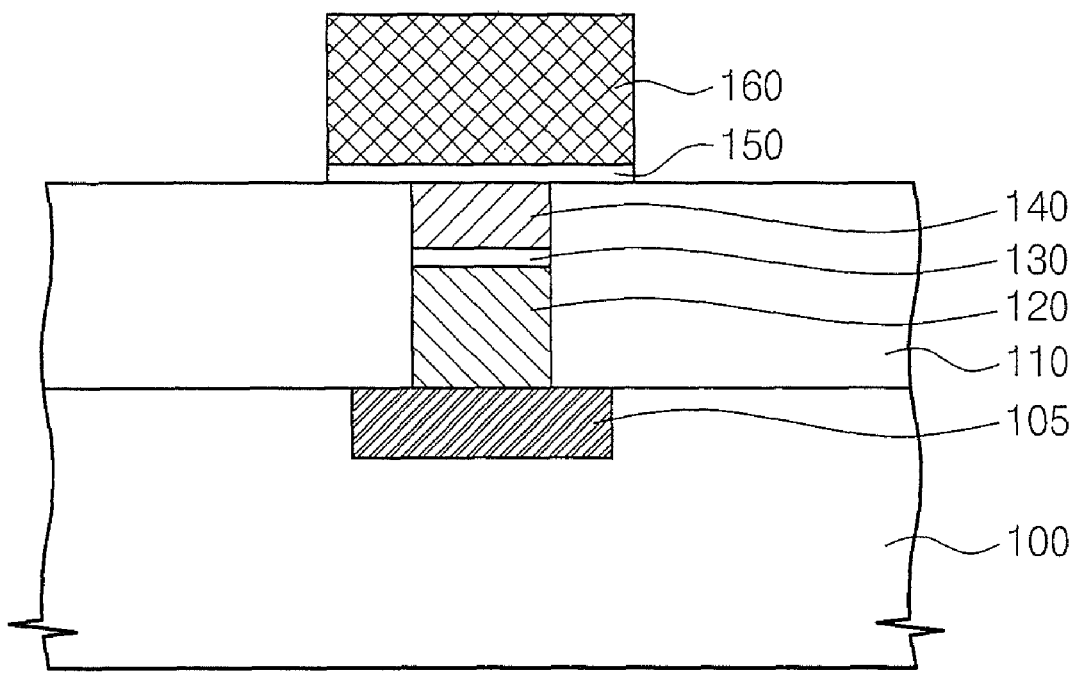

Referring to FIG. 7, a buffer oxide layer 150 is formed on the middle electrode 140 and the insulation layer 110. The buffer oxide layer 150 may be made of, for example, magnesium oxide. An upper electrode 160 is formed on the buffer oxide layer 150. The upper electrode 160 may be made of, for example, an amorphous cobalt-iron-boron alloy. When the buffer oxide layer 150 is made of magnesium oxide, in order to improve crystallization of the magnesium oxide, the middle electrode 140 may be made of, for example, an amorphous cobalt-iron-boron alloy.

According to some embodiments of the present invention, after the contact hole 115 is formed, the lower electrode 120, variable resistive oxide layer 130, and the middle electrode 140 are formed in the contact hole 115. Accordingly, the need to pattern the lower electrode 120, variable resistive oxide layer 130 and the middle electrode 140 to very small sizes may be relieved. Thus, problems of electrical short circuit, sidewall damage and/or etch slope that may occur during a patterning process, may be reduced and/or eliminated.

In some embodiments of the present invention, a buffer oxide layer and middle electrodes are provided in the resistive memory device. Insulation breakdown of the variable resistive oxide layer may be reduced or prevented, and stable switching characteristics may be secured by the buffer oxide layer.

As the lower electrode of the resistive memory device, variable resistive oxide layer, and the middle electrode are formed in the contact hole, patterning may not be required. Thus, reliability of the resistive memory device may be improved.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method of forming a resistive memory device comprising:
    forming an insulation layer on a semiconductor substrate including a conductive pattern;
    forming a contact hole in the insulation layer, the contact hole exposing the conductive pattern;
    forming a lower electrode in the contact hole;
    forming a variable resistive oxide layer in the contact hole on the lower electrode;
    forming a middle electrode in the contact hole on the variable resistive oxide layer;
    forming a buffer oxide layer on the middle electrode and the insulation layer; and
    forming an upper electrode on the buffer oxide layer.

2. The method of claim 1, wherein the contact hole is formed to have a width between about 10 nm and about 60 nm.

3. The method of claim 1, wherein the lower electrode comprises TiN, Ru, Ir, Ni, a cobalt-iron-boron alloy, a nickel-iron alloy, and/or tantalum.

4. The method of claim 3, wherein forming the lower electrode comprises:
    forming a preliminary lower electrode layer in the contact hole; and
    recessing the preliminary lower electrode.

5. The method of claim 3, wherein forming the variable resistive oxide layer comprises:
    oxidizing the lower electrode.

6. The method of claim 5, wherein the variable resistive oxide layer is formed to have a width between about 5 Å and about 30 Å.

7. The method of claim 1, wherein the middle electrode is formed by repeating deposition and ion beam etching processes.

8. The method of claim 1, wherein the middle electrode comprises Ru, Ir, Ni, a cobalt-iron-boron alloy, a nickel-iron alloy, and/or tantalum.

9. The method of claim 8, wherein the middle electrode comprises a first middle electrode and a second middle electrode on the first middle electrode, the first middle electrode including tantalum and/or Ru, and the second middle electrode including a cobalt-iron-boron alloy.

10. The method of claim 1, wherein the buffer oxide layer is formed to have a thickness between about 5 Å and about 30 Å.

11. The method of claim 10, wherein the buffer oxide layer comprises magnesium oxide.

12. The method of claim 11, wherein each of the middle electrode and the upper electrode includes an amorphous cobalt-iron-boron alloy.

* * * * *